US012574021B2

(12) United States Patent
Fabbro et al.

(10) Patent No.: US 12,574,021 B2
(45) Date of Patent: Mar. 10, 2026

(54) ZERO-CURRENT TURN-OFF DRIVER WITH SAFETY TURN-OFF FUNCTIONALITY

(71) Applicant: Infineon Technologies Austria AG, Villach (AT)

(72) Inventors: Simone Fabbro, Udine (IT); Alexander Uran, Ferlach (AT)

(73) Assignee: Infineon Technologies Austria AG, Villach (AT)

( * ) Notice: Subject to any disclaimer, the term of this patent is extended or adjusted under 35 U.S.C. 154(b) by 32 days.

(21) Appl. No.: 18/744,957

(22) Filed: Jun. 17, 2024

(65) Prior Publication Data

US 2025/0007504 A1     Jan. 2, 2025

(30) Foreign Application Priority Data

Jun. 27, 2023    (DE) .......................... 102023116935.1

(51) Int. Cl.
  *H03K 17/00*       (2006.01)
  *H03K 5/1536*      (2006.01)

(52) U.S. Cl.
  CPC .................................. *H03K 5/1536* (2013.01)

(58) Field of Classification Search
  CPC ............. H03K 5/1536; H03K 17/0822; H03K 17/284; H03K 2017/066; H03K 17/133; H03K 17/13; H03K 17/567; H03K 17/60; H03K 17/687; H02M 1/32
  See application file for complete search history.

(56) References Cited

U.S. PATENT DOCUMENTS

| | | | |
|---|---|---|---|
| 7,800,928 | B1 | 9/2010 | Dernovsek et al. |
| 12,088,283 | B2 * | 9/2024 | Li ....................... H03K 17/0406 |
| 2013/0300390 | A1 * | 11/2013 | Lee ........................ H02M 1/083 |
| | | | 323/282 |
| 2019/0261492 | A1 * | 8/2019 | Chen .................... H05B 47/115 |
| 2019/0334431 | A1 * | 10/2019 | Spohn ................. H02M 3/1557 |
| 2022/0029621 | A1 | 1/2022 | Brown et al. |
| 2023/0179112 | A1 * | 6/2023 | Betsuin ................. H02M 1/083 |
| | | | 363/89 |

* cited by examiner

*Primary Examiner* — Tuan T Lam
(74) *Attorney, Agent, or Firm* — Harrity & Harrity, LLP

(57)            ABSTRACT

The present application relates to a gate driver including a zero-crossing detection circuit and a control signal generation circuit. The zero-crossing detection circuit receives a load current signal indicative of a load current of a power switch, detects a zero crossing of the load current, and generates a zero-crossing detection signal based on the detected zero-crossing. The control signal generation circuit receives an input control signal indicative of one of a turn-on and a turn-off of the power switch. If the input control signal is indicative of the turn-off of the power switch, the control signal generation circuit generates a turn-off signal based on the zero-crossing detection signal, determines if a time-out interval subsequent to the indication of the turn-off has expired, generates the turn-off signal regardless of the zero-crossing detection signal if the turn-off time interval has expired, and provides the turn-off signal to the power switch.

13 Claims, 6 Drawing Sheets

ZERO-CURRENT TURN-OFF DRIVER WITH SAFETY TURN-OFF FUNCTIONALITY

CROSS-REFERENCE TO RELATED APPLICATION

This application claims priority to German Patent Application No. 102023116935.1 filed on Jun. 27, 2023, the content of which is incorporated by reference herein in its entirety.

TECHNICAL FIELD

The implementation generally relates to gate drivers and more precisely to soft-switching gate drivers.

BACKGROUND

A solid-state relay (SSR) including a thyristor inherently provides turn-off zero-current-switching (ZCS), e.g., the SSR only turns off when a load current crosses 0 A. Based on ZCS, the SSR enables soft-switching, e.g., switching with reduced or even no switching losses as the load current may be at or close to 0 A while switching off. In addition to reduced switching losses, soft switching based on ZCS may also increase the reliability of a driven power switch due to a decrease in current induced voltage overshoots. However, the ZCS functionality may cause safety issues during turn-off in cases where the load current never crosses GA. In these cases, the thyristor would not turn off due to the inherent ZCS functionality. These cases may arise, for example, when a current, provided to the SSR by an inverter, changes from alternating current to direct current due to a failure at the inverter or when a load coupled to the SSR provides a leakage current causing the current to never cross 0 A.

Despite these safety issues, ZCS is nonetheless desirable given the reduction in switching losses and increased reliability of the driven power switch. Accordingly, approaches exist to bring ZCS-functionality to switches not providing ZCS functionality inherently, such as metal oxide field effect transistors (MOSFETs), insulated gate bipolar transistors (IGBTs) or bipolar junction transistors (BJTs), e.g., by using snubbers or similar circuitry. Accordingly, to enable ZCS-functionality for these types of switches, additional circuitry is required.

Accordingly, it is an objective of the present disclosure to provide ZCS functionality for any type of switch with reduced effort while enabling safe turn-off if the load current does not reach or cross GA.

SUMMARY

To achieve this objective, the present disclosure provides a gate driver configured to control a power switch. The gate driver includes a zero-crossing detection circuit coupled to a load terminal of the power switch. The zero-crossing detection circuit is configured to receive a load current signal indicative of a load current of the power switch, detect a zero crossing of the load current based on the received load current signal and generate a zero-crossing detection signal based on the detected zero-crossing of the load current signal. The gate driver further includes a control signal generation circuit coupled to the zero-crossing detection circuit. The control signal generation circuit is configured to receive an input control signal indicative of one of a turn-on and a turn-off of the power switch. The control signal generation circuit is further configured to, if the input control signal is indicative of the turn-off of the power switch, generate a turn-off signal based on the zero-crossing detection signal, determine if a time-out interval subsequent to the indication of the turn-off has expired, generate the turn-off signal regardless of the zero-crossing detection signal if the time-out interval has expired, and provide the turn-off signal to a control terminal of the power switch.

The present disclosure further provides a method for controlling a power switch using a gate driver. The method includes receiving a load current signal indicative of a load current of the power switch, detecting a zero crossing of the load current based on the received load current signal, generating a zero-crossing detection signal based on the detected zero-crossing of the load current signal, receiving an input control signal indicative of one of a turn-on and a turn-off of the power switch, and, if the input control signal is indicative of the turn-off of the power switch, generating a turn-off signal based on the zero-crossing detection signal, determining if a time-out interval subsequent to the indication of the turn-off has expired, generating the turn-off signal regardless of the zero-crossing detection signal if the time-out interval has expired, and providing the turn-off signal to a control terminal of the power switch.

BRIEF DESCRIPTION OF THE DRAWINGS

Examples of the present disclosure will be described with reference to the following appended drawings, in which like reference signs refer to like elements.

It should be understood that the above-identified drawings are in no way meant to limit the present disclosure. Rather, these drawings are provided to assist in understanding the present disclosure. The person skilled in the art will readily understand that aspects of the present implementation shown in one drawing may be combined with aspects in another drawing or may be omitted without departing from the scope of the present disclosure.

DETAILED DESCRIPTION

The present disclosure generally provides a gate driver configured to control a power switch and a corresponding method. The gate driver is configured to receive an input control signal instructing the gate driver to turn on and off the power switch and to switch the power switch accordingly. At least when turning off the power switch, the gate driver is configured to do so if a load current of the power switch crosses a current level of 0 A. To this end, the gate driver is configured to detect a zero-crossing, e.g., to detect whether the load current crosses the current level of 0 A, and to turn off the power switch in accordance with the input control signal once the zero-crossing is detected. In order to ensure that the power switch is safely turned off, the gate driver is further configured to turn off the power switch regardless of the detection of the zero-crossing if a time-out interval has expired. The time-out interval starts once the input control signal indicates that the power switch is to be turned off and expires after a time duration defined in accordance with a turn-off delay acceptable for the actual implementation of the gate driver in view of the voltage levels at which the power switch operates.

The gate driver of some examples of the present disclosure may be implemented as a solid-state isolator. In such examples, the input control signal causes power to be provided to a control terminal of the power switch until indicating the turn-off of the power switch. Accordingly, the gate driver in such examples continues providing power to the control terminal of the power switch until the zero-crossing is detected or until the expiry of the time-out interval, respectively. It will thus be understood that the term "gate driver" in the context of the present disclosure is to be understood as referring to both driving circuits coupling the control terminal of the power switch to one of a turn-off voltage and a turn-on voltage in accordance with the input control signal, and to solid-state relays generating the turn-on voltage and the turn-off voltage in accordance with the input control signal.

Figure 1A:
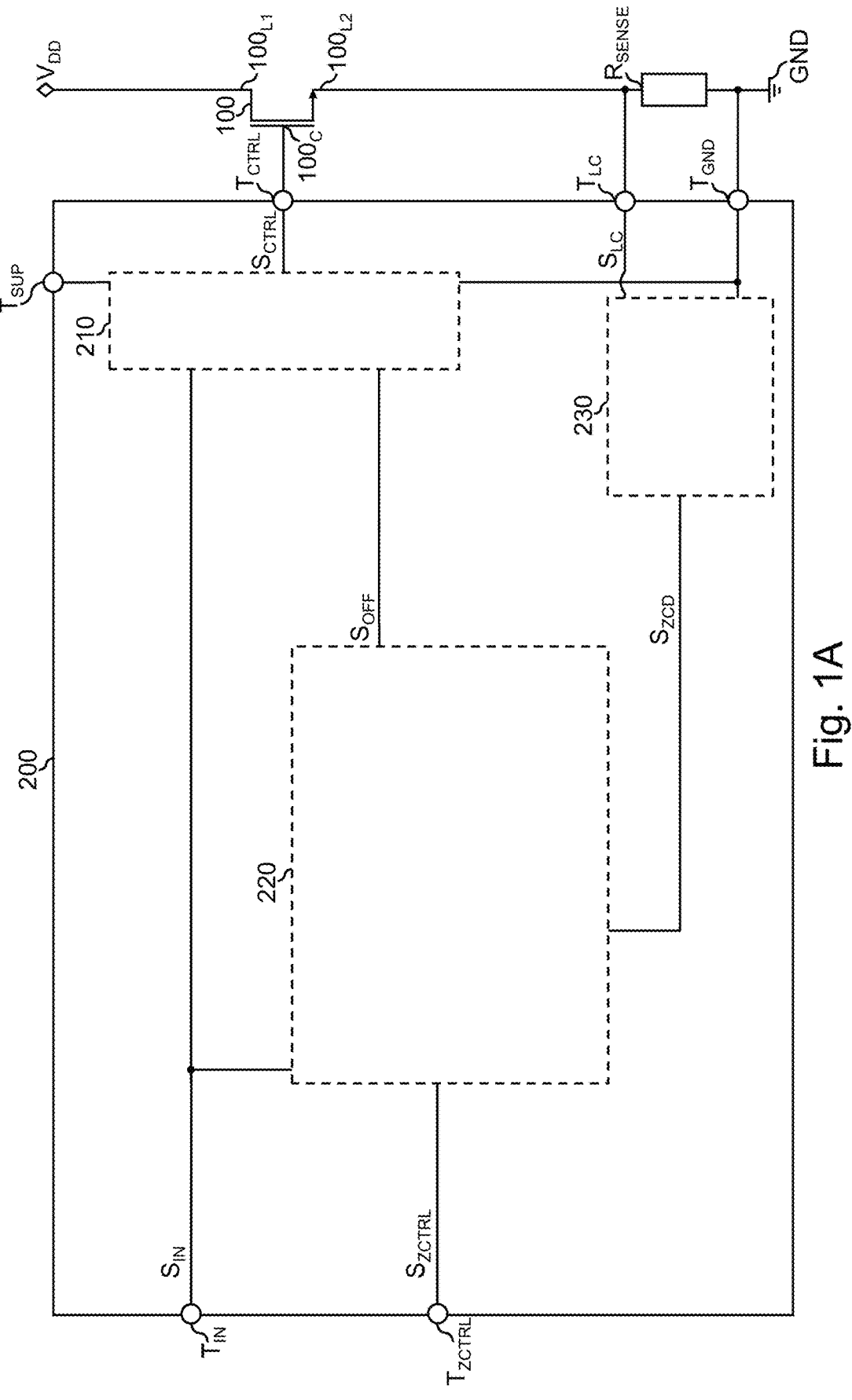
FIGS. 1A-1D illustrate a gate driver configured to control a power switch according to examples of the present disclosure.
Figure 1B:
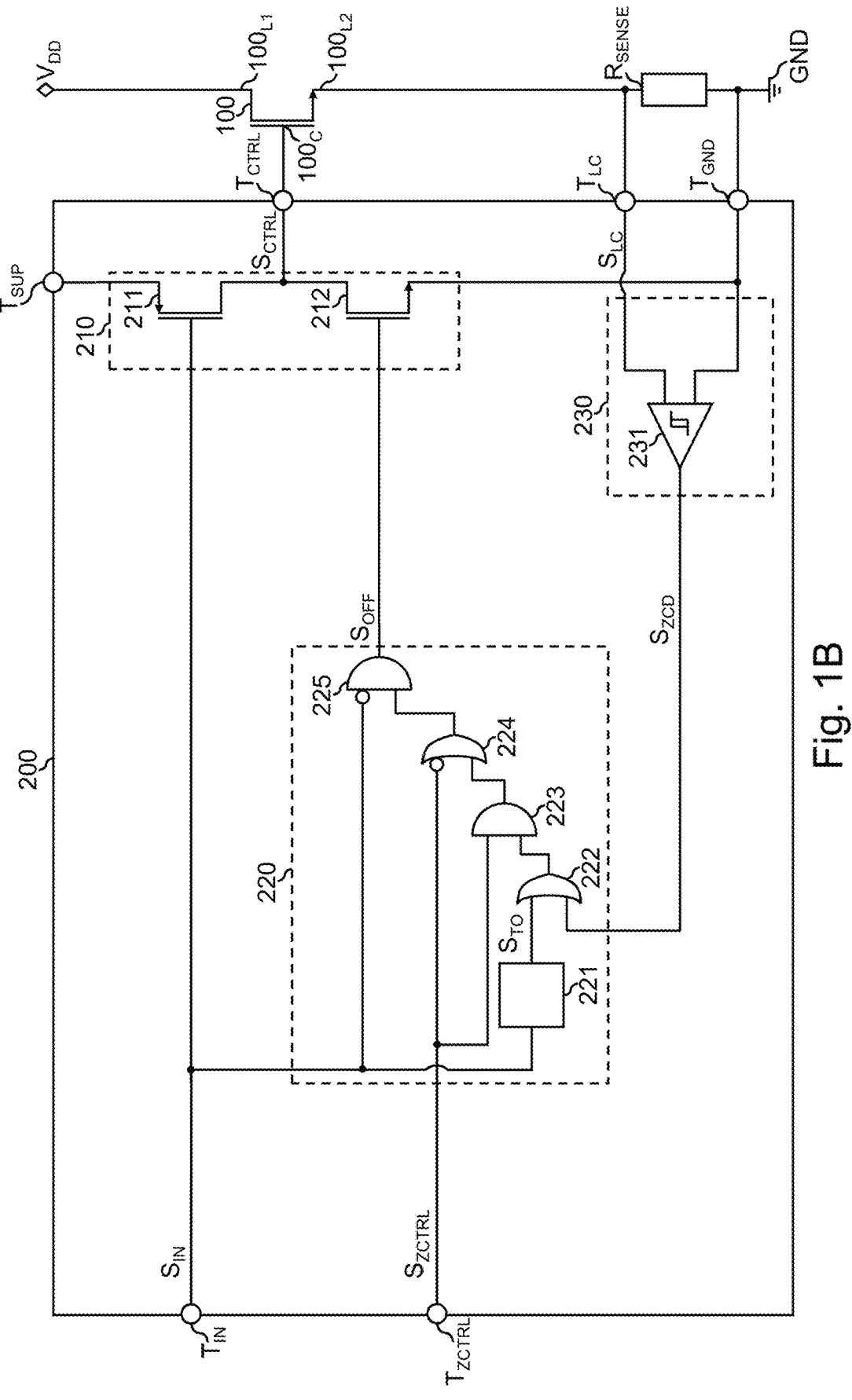
Figure 1C:
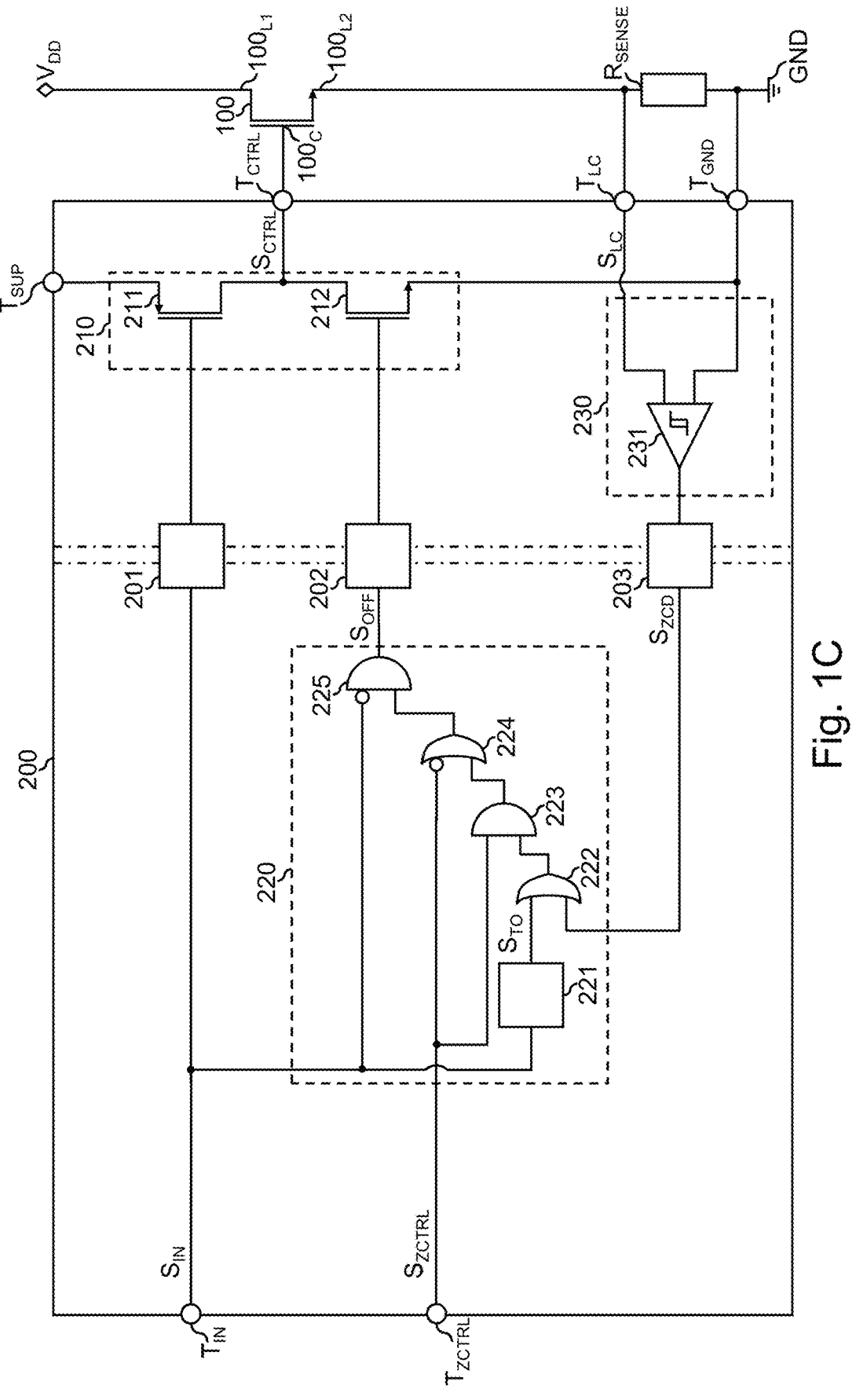
Figure 1D:
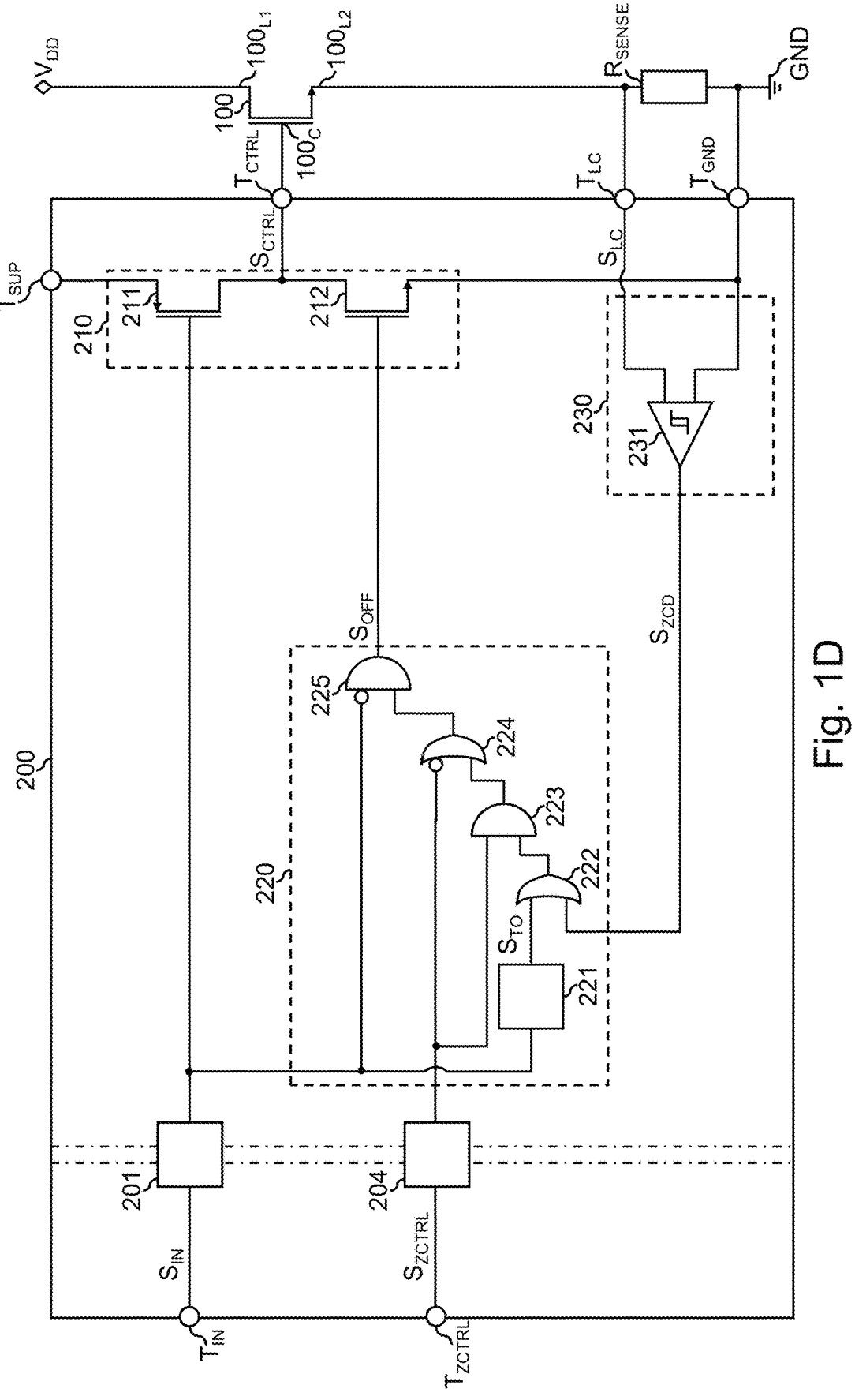
Figure 2:
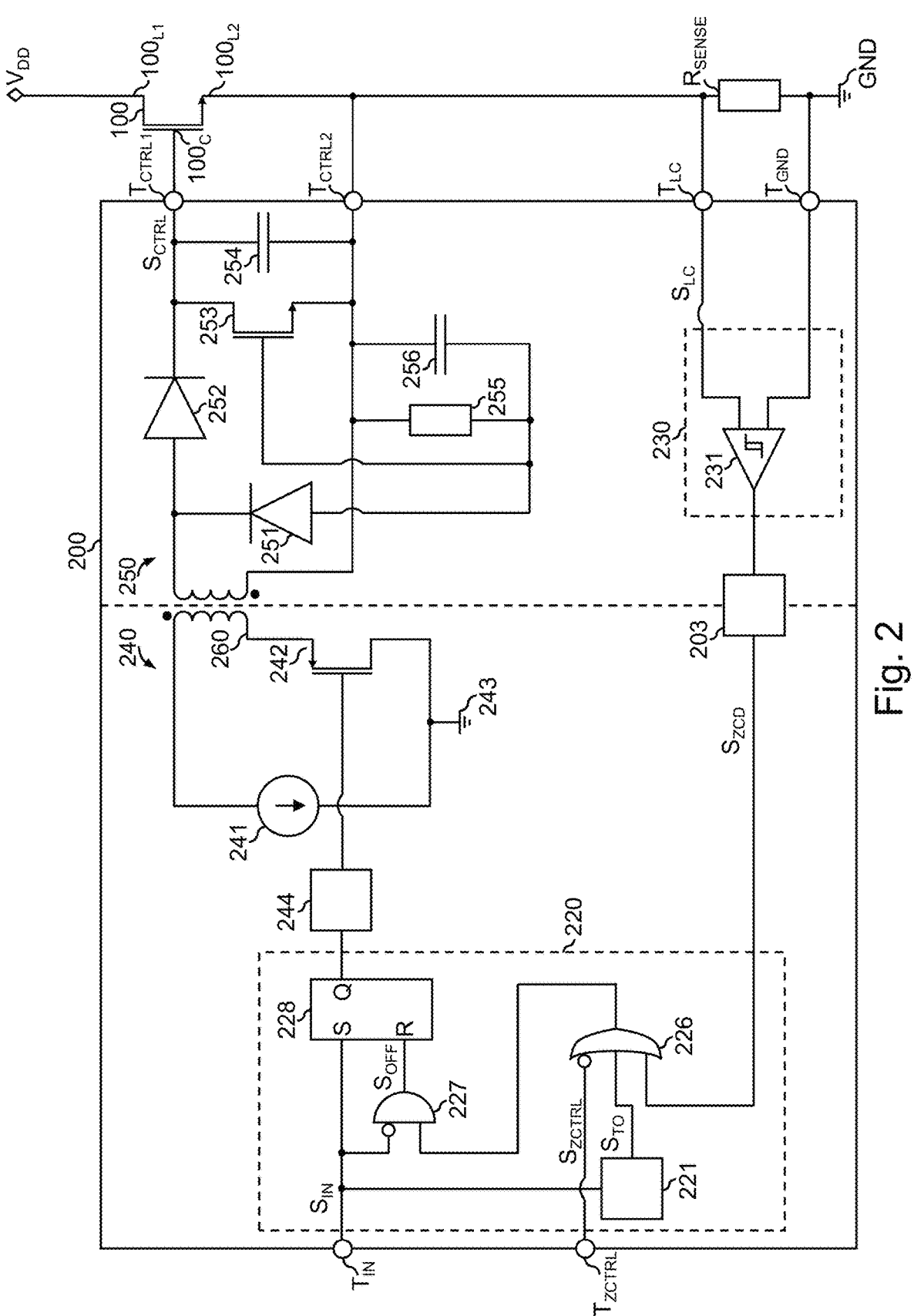
FIG. 2 illustrates the gate driver including a transformer arranged across a galvanic isolation according to examples of the present disclosure.
Figure 3:
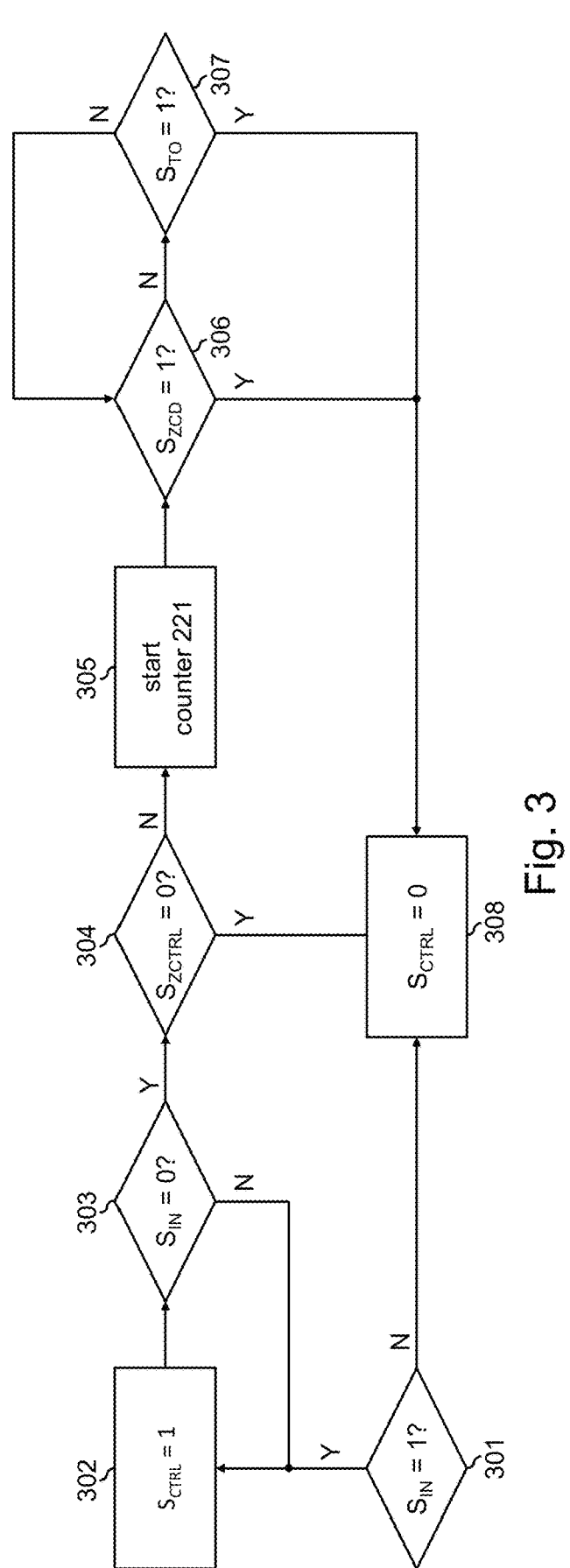
FIG. 3 provides a flowchart of a method for controlling a power switch using the gate driver according to examples of the present disclosure.

This general concept will be explained with reference to the appended drawings, with FIGS. 1A to 1D illustrating the gate driver as a driving circuit and FIG. 2 illustrating the gate driver as a solid-state isolator. In addition, FIG. 3 provides a flow-chart of a method for controlling the power switch in accordance with the above general concept.

FIG. 1A illustrates a gate driver 200 configured to control a power switch. To this end, gate driver 200 is illustrated in FIG. 1A as being coupled to a power switch 100.

Power switch 100 may be any kind of power switch configured to have a high voltage blocking capability. For example, the power switch may be able to block voltages above at least 400 V, such as 450 V, 900 V, 1200 V, 1800 V or 3300 V. To achieve such voltage blocking capabilities, the power switch may for example be a silicon or silicon carbide (SiC) MOSFET, a silicon or SiC IGBT or a Gallium nitride high electron mobility transistor (GaN-HEMT). It will be understood that both the voltage levels and the technology types discussed with regard to the power switch are merely provided as an example. The present disclosure may be practiced with other high voltage levels and other power switch technologies than those mentioned here.

In some examples of the present disclosure, power switch 100 may include current sense capability. That is, power switch 100 may be configured to provide a signal indicative of a load current of power switch 100, e.g., the current flowing between first load terminal $100_{L1}$ and second load terminal $100_{L2}$. The current sense capability may for example be implemented by branching off a current flowing through some of the transistor cells forming power switch 100, such as one or ten transistor cells. It will be understood that the current sense capability of power switch 100 may also be provided in other ways and that in some examples of the present disclosure the current sense capability of power switch 100 may not be present.

Power switch 100 has a control terminal $100_C$, a first load terminal $100_{L1}$ and a second load terminal $100_{L2}$. Control terminal $100_C$ is coupled to gate driver 200. First load terminal $100_{L1}$ may be coupled to a supply voltage $V_{DD}$, which may e.g., provide a voltage level of 600 V, 1200 V or 1800 V. Second load terminal $100_{L2}$ may be coupled to a current sense resistor $R_{SENSE}$, as shown, or to a ground voltage GND. If power switch 100 is used in a half-bridge configuration, first load terminal $100_{L1}$ and/or second load terminal $100_{L2}$ may also be coupled to another power switch. Furthermore, power switch 100 may be coupled to a load at one of its load terminals. If power switch 100 includes the current sense capability, power switch 100 may further include a current sense terminal.

Gate driver 200 comprises a zero-crossing detection circuit 230. Zero-crossing detection circuit 230 is configured to receive a load current signal $S_{LC}$ indicative of the load current of power switch 100 and to generate a zero-crossing detection signal $S_{ZCD}$ based on detecting a zero-crossing of load current signal $S_{LC}$. As discussed above, zero-crossing in the context of the present disclosure refers to the load current of power switch 100 and thereby load current signal $S_{LC}$ reaching or crossing a value corresponding to a current level of the load current of 0 A.

To this end, zero-crossing detection circuit 230 may be coupled to a load current terminal $T_{LC}$ and to a ground terminal $T_{GND}$ of gate driver 200, as shown in FIGS. 1A to 2. Load current terminal $T_{LC}$ may be configured to receive the load current signal $S_{LC}$. Ground terminal $T_{GND}$ may be configured to be coupled to ground voltage GND, which may serve as a reference voltage to detect the zero-crossing. In the example of FIGS. 1A to 2, load current terminal $T_{LC}$ and ground terminal $T_{GND}$ are further coupled to current sense resistor $R_{SENSE}$. Current sense resistor $R_{SENSE}$ of the example of FIGS. 1A to 2 is coupled in series with power switch 100 and thus receives the load current of power switch 100. Accordingly, zero-crossing detection circuit 230 may detect the zero-crossing based on a voltage drop at current sense resistor $R_{SENSE}$. In this example, zero-crossing detection circuit 230 may include a zero-crossing comparator 231 coupled to ground terminal $T_{GND}$ and to load current terminal $T_{LC}$. Zero-crossing comparator 231 may be configured to output zero-crossing detection signal $S_{ZCD}$ with a value indicating that load current signal $S_{LC}$ has crossed a value corresponding to a current level of the load current of 0 A and maintain this value of zero-crossing detection signal $S_{ZCD}$ until power switch 100 has been turned off. In other examples, load current terminal $T_{LC}$ may be coupled to the current sense terminal of power switch 100, if power switch 100 includes the current sense capability, or may be coupled to other current sensing elements, such as a Hall effect sensor, a giant magnetoresistance (GMR) sensor or a tunnel magnetoresistance (TMR) sensor. In other words, zero-crossing detection circuit 230 may be configured to interface with any kind of current sensing element configured to sense the load current of power switch 100 and to thereby provide the load current signal $S_{LC}$ to zero-crossing detection circuit 230. Based on the load current signal $S_{LC}$, zero-crossing detection circuit 230 is configured to generate zero-crossing detection signal $S_{ZCD}$, e.g., by comparing load current signal $S_{LC}$ to a reference voltage, as shown in FIG. 1B to 2, or by any other means providing an indication based on load current signal $S_{LC}$ crossing a value indicative of the load current of power switch 100 crossing a current value of 0 A.

Gate driver 200 further comprises a control signal generation circuit 220. Control signal generation circuit 220 is coupled to zero-crossing detection circuit 230 in order to receive zero-crossing detection signal $S_{ZCD}$. Control signal generation circuit 220 is configured to receive an input control signal Sm indicative of one of a turn-on and a turn-off of power switch 100. Input control signal Sm thus determines whether power switch 100 is to be closed or opened and accordingly instructs power switch 100 to either open or close power switch 100. Input control signal $S_{IN}$ may for example be provided by a microcontroller or some other control logic coupled to gate driver 200. To receive input control signal Sm, gate driver 200 may include a control input terminal $T_{IN}$ and control signal generation circuit 220 may accordingly be coupled to control input terminal $T_{IN}$.

If input control signal $S_{IN}$ is indicative of the turn-off of the power switch, control signal generation circuit 220 is configured to generate a turn-off signal $S_{OFF}$ based on zero-crossing detection signal $S_{ZCD}$. That is, if input control signal $S_{IN}$ indicates to gate driver 200 that power switch 100 is to be turned off and if zero-crossing detection signal $S_{ZCD}$ indicates that the zero-crossing of the load current of power switch 100 has occurred, control signal generation circuit 220 generates turn-off signal $S_{OFF}$. In addition, control signal generation circuit 220 is configured to determine if a time-out interval subsequent to the indication of the turn-off by input control signal $S_{IN}$ has expired. If the time-out interval has expired, control signal generation circuit 220 is configured to generate turn-off signal $S_{OFF}$ regardless of zero-crossing detection signal $S_{ZCD}$. In other words, control signal generation circuit 220 generates turn-off signal $S_{OFF}$ following the instruction by input control signal $S_{IN}$ that gate driver 200 should turn off power switch 100 once the zero-crossing of the load current of power switch 100 is detected. However, if the zero-crossing of the load current of power switch 100 is not detected within the time-out interval after input control signal Sm indicating the turn-off of power switch 100, control signal generation circuit 220 generates turn-off signal $S_{OFF}$ even if the zero-crossing of the load current of power switch 100 has not been detected.

In summary, following the indication by input control signal $S_{IN}$ to turn-off power switch 100, control signal generation circuit 220 generates turn-off signal $S_{OFF}$ once zero-crossing detection signal $S_{ZCD}$ indicates the zero-crossing of the load current of power switch 100 or once the time-out interval has expired. Control signal generation circuit 220 then provides turn-off signal $S_{OFF}$ to control terminal $T_{CTRL}$ of power switch 100. Control signal generation circuit 220 thus enables soft-switching while ensuring a safe turn-off if the zero-crossing of the load current does not occur as quickly as required by the environment in which gate driver 200 is deployed. The functionality of control signal generation circuit 220 may thus also be referred to as safe soft-switching.

In order to determine if the time-out interval subsequent to input control signal $S_{IN}$ indicating the turn-off of power switch 100 has expired, control signal generation circuit 220 may further be configured to count a time starting at the indication of the turn-off by input control signal $S_{IN}$ and compare the counted time to a time threshold, the time threshold defining the time-out interval.

In some examples of the present disclosure, it may be desirable with regard to safety concerns to controllably decide between turning power switch 100 off immediately upon input control signal $S_{IN}$ indicating that power switch 100 is to be turned off and turning power switch 100 off only upon the zero-crossing of the load current or the expiry of the time-out interval. To this end, control signal generation circuit 220 may further be configured to receive a zero-crossing control activation signal $S_{ZCTRL}$. Zero-crossing control activation signal $S_{ZCTRL}$ may have a zero-crossing control active value and a zero-crossing control inactive value. When zero-crossing control activation signal $S_{ZCTRL}$ has the zero-crossing control active value, control signal generation circuit 220 may only generate turn-off signal $S_{OFF}$ upon the zero-crossing of the load current of power switch 100 or if the zero-crossing of the load current of power switch 100 does not occur within the time-out interval. When zero-crossing control activation signal $S_{ZCTRL}$ has the zero-crossing control inactive value, control signal generation circuit 220 may generate turn-off signal $S_{OFF}$ immediately upon input control signal $S_{IN}$ indicating that power switch 100 is to be turned off. In other words, if input control signal SIN is indicative of the turn-off of the power switch and if the zero-crossing control activation signal $S_{ZCTRL}$ has the zero-crossing control inactive value, control signal generation circuit 220 may generate turn-off signal $S_{OFF}$ regardless of zero-crossing detection signal $S_{CZD}$ and without determining if the time-out interval has expired. To receive zero-crossing control activation signal $S_{ZCTRL}$, control signal generation circuit 220 may be coupled to a zero-crossing control terminal $T_{ZCTRL}$ of gate driver 200. Zero-crossing control activation signal $S_{ZCTRL}$ may be provided by a microcontroller or some other logic circuitry coupled to gate driver 200 and which may also provide input control signal $S_{IN}$.

In summary, in examples of gate driver 200 in accordance with the present disclosure which receive zero-crossing control activation signal $S_{ZCTRL}$, gate driver 200 may controllably switch between turning power switch 100 off upon input control signal Sm indicating that power switch 100 is to be turned off or upon either the zero-crossing of the load current of power switch 100 or the expiry of the turn-off interval if the zero-crossing of the load current does not occur within the turn-off interval. In other words, based on zero-crossing control activation signal $S_{ZCTRL}$, gate driver 200 may controllably switch between hard switching and safe soft switching.

To implement the above-discussed functionality of control signal generation circuit 220, control signal generation circuit 220 may include turn-off counter 221, first OR gate 222, first AND gate 223, second OR gate 224 and second AND gate 225.

Turn-off counter 221 may be configured to count the time elapsed after the indication by input control signal $S_{IN}$ that power switch 100 is to be turned off and to compare the counted time with the time-out interval. Based on the counted time and the comparison with the time-out interval, turn-off counter 221 may generate time-out signal $S_{TO}$.

Based on the various signals discussed above, first OR gate 222, first AND gate 223, second OR gate 224 and second AND gate 225 may implement the following logic function:

$$S_{OFF} = \left( \left( (S_{TO} \vee S_{ZCD}) \wedge S_{ZCTRL} \right) \vee \overline{S_{ZCTRL}} \right) \wedge \overline{S_{IN}} \qquad (1)$$

Equation (1) thus represents an example of the above-discussed functionality of control signal generation circuit 220 if zero-crossing control activation signal $S_{ZCTRL}$ is implemented. If zero-crossing control activation signal $S_{ZCTRL}$ is not implemented, equation (1) may be simplified a shown in equation (2):

$$S_{OFF} = (S_{TO} \vee S_{ZCD}) \wedge \overline{S_{IN}} \qquad (2)$$

It will be understood that the implementation of control signal generation circuit 220 with logic gates is merely provided as an example. The above-discussed functionality may be implemented e.g., as program code performed by a microcontroller integrated into gate driver 200, be programmed into a field-programmable gate array (FPGA) or may be implemented by any other type of circuitry suitable to generate turn-off signal $S_{OFF}$ in accordance with the above-discussed principles.

Gate driver 200 may further comprise an output stage 210. Output stage 210 may be configured to generate an output control signal $S_{CTRL}$ by coupling gate driver control terminal $T_{CTRL}$ and thereby control terminal $100_C$ to one of a turn-on voltage and a turn-off-voltage responsive to input control signal Sm and turn-off-signal $S_{OFF}$. The turn-on voltage may e.g., be voltage provided by a voltage source coupled to supply voltage terminal $T_{SUP}$ of gate driver 200, which may exceed a threshold voltage of power switch 100. The turn-off voltage may e.g., be ground voltage GND. To implement the functionality of output stage 210, output stage 210 may include a turn-on transistor 211 and a turn-off transistor 212 arranged in a half-bridge configuration. Turn-on transistor 211 may receive input control signal $S_{IN}$ at its control terminal and may be coupled to supply voltage terminal $T_{SUP}$ and gate driver control terminal $T_{CTRL}$. Turn-off transistor 212 may receive turn-off signal $S_{OFF}$ at its control terminal and may be coupled to ground terminal $T_{GND}$ and gate driver control terminal $T_{CTRL}$.

It will be understood that the control terminal of turn-on transistor 211 is shown in FIGS. 1B to 1D as being coupled directly to input control terminal $T_{in}$ for reasons of simplicity. In some examples of the present disclosure (not shown) intervening elements may be coupled between the control terminal of turn-on transistor 211 and input control terminal $T_{in}$, such as a logic circuit providing additional functions of the gate driver. In one example of the present disclosure, an intervening logic circuit may be arranged between the control terminal of turn-on transistor 211 and input control terminal $T_{in}$, which may be configured to keep turn-on transistor 211 in an on state even after input control signal $S_{in}$ indicates a turn-off of switch 100 until turn-off signal $S_{off}$ is generated by control signal generation circuit 220. Such logic may also be integrated in control signal generation circuit 220. Keeping turn-on transistor 211 in an on state until turn-off signal $S_{off}$ is generated avoids situations in which output control signal $S_{CTRL}$ may be in an undefined state, e.g., situations in which a potential at output terminal $T_{CTRL}$ may be left floating, which may be the case when neither of turn-on transistor 211 and turn-off transistor 212 is turned on.

In some examples of the present disclosure, gate driver 200 may include a galvanic isolation separating gate driver 200 into an input side and an output side in order to protect components coupled to the input side of gate driver 200 from the high voltages switched by power switch 100, e.g., if an isolation between control terminal $100_C$ and first load terminal $100_{L1}$ fails. The input side may be the side of gate driver 200 coupled to the input terminals of gate driver 200 receiving signals from other logic circuits, such as microcontrollers, e.g., control input terminal $T_{IN}$ and zero-crossing control terminal $T_{ZCTRL}$. The output side may be the side of gate driver 200 coupled to the output terminal of gate driver 200, e.g., control terminal $T_{CTRL}$. The galvanic isolation is illustrated in FIGS. 1C and 1D by two vertical dashed lines. In such examples, control signal generation circuit 220 may be arranged at the input side, as illustrated in FIG. 1C, or at the output side, as illustrated in FIG. 1D.

As shown in FIG. 1C, if control signal generation circuit 220 is arranged at the input side, gate driver 200 may further comprise a turn-off signal transfer circuit 202 configured to transfer turn-off signal $S_{OFF}$ across the galvanic isolation. Further, gate driver 200 may include an input control signal transfer circuit 201 configured to transfer input control signal $S_{in}$ across the galvanic isolation. In the example of FIG. 1C, zero-crossing detection circuit 230 is arranged at the output side. Accordingly, gate driver 200 of the example of FIG. 1C also includes a zero-crossing transfer circuit 203 configured to transfer zero-crossing control activation signal $S_{ZCTRL}$ across the galvanic isolation. In examples of gate driver 200 in which zero-crossing detection circuit 230 is arranged at the input side, gate driver 200 may also include a load current signal transfer circuit configured to transfer load current signal $S_{LC}$ to the input side.

As shown in FIG. 1D, if control signal generation circuit 220 is arranged at the output side, gate driver 200 may further comprise a turn-off signal transfer circuit 202 configured to transfer turn-off signal $S_{OFF}$ across the galvanic isolation. Further, gate driver 200 of FIG. 1D may also include input control signal transfer circuit 201 configured to transfer input control signal $S_{in}$ across the galvanic isolation.

The various signal transfer circuits shown in and discussed with regard to FIGS. 1C and 1D may for example be implemented using level shifters, optocouplers or coreless transformers or any other circuitry configured to transfer a signal from one voltage domain to another voltage domain across an isolation barrier.

By including output stage 210, the examples of gate driver 200 of FIGS. 1A to 1D correspond to a gate driver coupling a control terminal of the driven switch to one of two voltages responsive to a control signal. To illustrate that the above-discussed functionality of control signal generation circuit 220 may also be used in gate driver 200 implemented as a solid state isolator, FIG. 2 provides an example of gate driver 200 being implemented a solid state isolator.

FIG. 2 illustrates gate driver 200 as being configured to generate one of a turn-on voltage and a turn-off voltage based on the principles discussed above with regard to the generation of turn-off signal $S_{OFF}$.

Gate driver 200 of FIG. 2 includes a galvanic isolation barrier illustrated by a vertical dashed line. Across the galvanic isolation barrier of FIG. 2, a transformer 260 is coupled. Gate driver 200 may thus be separated by the galvanic isolation and transformer 260 into an input side 240, e.g., the circuitry coupled to the primary side of transformer 260, and an output side 250, e.g., the circuitry coupled to the secondary side of transformer 260. Transformer 260 may be formed based on any type of galvanic isolation, such as a coreless transformer.

Input side 240 may include an input voltage source 241, an input switch 242, an input ground 243, an on-off-keying (OOK) element 244 and control signal generation circuit 220. OOK element 244 may be coupled between control input terminal $T_{IN}$ and a control terminal of input switch 242. By being coupled between control input terminal $T_{IN}$ and the control terminal of input switch 242, OOK element 244 may generate an OOK signal responsive to input control signal $S_{IN}$. In other words, OOK element 244 may generate the OOK signal as long as input control signal $S_{IN}$ indicates that power switch 100 is to be turned on. Further, by being coupled to the control terminal of input switch 242, OOK element 244 may control input switch 242 based on the OOK signal. While input switch 242 is controlled based on the OOK signal to be in a conductive state, a magnetization current may flow through a primary winding of transformer 260. The magnetization current flowing through the primary side of transformer 260 may cause magnetic energy to be stored in transformer 260 and may thereby cause a voltage drop at the secondary side of transformer 260. The voltage drop at the primary side may be inverted with respect to the voltage drop at the primary side of transformer 260 caused by input voltage source 241. Once input switch 242 is controlled based on the OOK signal to no longer be in the conductive state, the magnetic energy stored in transformer 260 may be discharged at the secondary side of transformer 260, which causes an inverse voltage drop at the secondary side.

It will be understood that input source 241 is merely shown as being arranged at input side 240 and thus inside gate driver 200 as an example. In some examples of the present disclosure, input source 241 may be provided externally. In such examples of the present disclosure, input side 240 may include terminals configured to be coupled to input source 241.

As can be seen from the discussion of input side 240, input control signal $S_{IN}$ may provide power to gate driver 200 by causing OOK element 244 to generate the OOK signal, which may cause the magnetization current to flow through the primary side of transformer 260. The flow of the magnetization current through the primary side of transformer 260 in turn causes energy to be discharged at the secondary side of transformer 260. Consequently, control signal generation circuit 220 of FIG. 2 needs to continue to cause OOK element 244 to generate the OOK signal following input control signal Sm indicating to turn off power switch 100 in order to implement the safe soft switching functionality discussed above. Accordingly, control signal generation circuit 220 of FIG. 2 may be configured to provide power to gate driver 200 subsequent to input control signal Sm indicating the turn-off of power switch 100 until the generation of turn-off signal $S_{OFF}$, e.g., subsequent to input control signal $S_{IN}$ ceasing to provide power to gate driver 200 and until either the zero-crossing of the load current of power switch 200 or the expiry of the time-out interval if the zero-crossing of the load current does not occur during the time-out interval.

In order to provide power to gate driver 200 subsequent to input control signal Sm ceasing to provide power to gate driver 200 and until either the zero-crossing of the load current of power switch 200 or the expiry of the time-out interval if the zero-crossing of the load current does not occur during the time-out interval, control signal generation circuit 220 may include a third OR gate 226, third AND gate 227 and an input control signal latch 228.

Input control signal latch 228 may be coupled between control input terminal $T_{IN}$ and OOK element 244. More precisely, a set input of input control signal latch 228 may receive input control signal $S_{IN}$ and may provide a latched value of input control signal $S_{IN}$ at an output of input control signal latch 228. The output of input control signal latch 228 may be coupled to OOK element 244. Based on the latched value of input control signal $S_{IN}$, input control signal latch 228 may continue to cause OOK element 244 to provide the OOK signal to the control terminal of input switch 242 following input control signal $S_{IN}$ indicating that power switch 100 is to be turned off. To turn off power switch 100 once the zero-crossing is detected or if time-out signal $S_{TO}$ indicates that a zero-crossing has not occurred during the time-out interval, turn-off signal $S_{OFF}$ may be provided to a reset input of input control signal latch 228. In other words, turn-off signal $S_{OFF}$ in the example of FIG. 2 may be a reset signal of input control signal latch 228. In the example of FIG. 2, turn-off signal $S_{OFF}$ may be generated by third OR gate 226 and third AND gate 227 as shown in equation (3):

$$S_{OFF} = \left(S_{TO} \vee S_{ZCD} \vee \overline{S_{ZCTRL}}\right) \wedge \overline{S_{IN}} \qquad (3)$$

It will be understood that the concept of control signal generation circuit 220 based on latching input control signal $S_{IN}$ is merely provided as an example. Control signal generation circuit 220 may, in the context of gate driver 200 being implemented as a solid state isolator, be configured in any manner suitable to continue providing power to gate driver 200 until either the zero-crossing of the load current of power switch 100 is detected or if the time-out interval has expired without the zero-crossing occurring following input control signal Sm ceasing to provide power to gate driver 200.

Output side 250 may include a first diode 251, a second diode 252, a turn-off switch 253, a first buffer capacitor 254, resistor 255, a second buffer capacitor 256, zero-crossing detection circuit 230 and zero-crossing transfer circuit 203. First diode 251, resistor 255 and second buffer capacitor 256 may also collectively be referred to as a negative charge pump. Output side 250 may further include two output terminals $T_{CTRL1}$ and $T_{CTRL2}$, which may respectively be coupled to control terminal $100_C$ and second load terminal $100_{L2}$. Zero-crossing detection circuit 230 and zero-crossing transfer circuit 203 may have the functionality discussed above with regard to FIGS. 1A to 1D.

While input switch 242 is controlled based on either input control signal $S_{IN}$ or control signal generation circuit 220 to cause the inverse voltage drop at the secondary side of transformer 260, second buffer capacitor 256 may be charged. The energy charged in second buffer capacitor 256 may be used to charge a control terminal of turn-off switch 253, causing turn-off switch 253 to be conductive. While turn-off switch 253 is caused to be conductive, control terminal $100_C$ and second load terminal $100_{L2}$ may be coupled, keeping power switch 100 in a non-conductive state. Further, since the inverse voltage at the secondary side of transformer 260 causes a potential at the anode of second diode 252 to be below the potential at the cathode of second diode 252, second diode 252 blocks current from flowing toward control terminal $100_C$.

Once input switch 242 is controlled to no longer be in the conductive state based on either input control signal Sm or control signal generation circuit 220, the voltage at the secondary side of transformer 260 is no longer inverted. Accordingly, second diode 252 may no longer block current from flowing toward control terminal $100_C$. This may allow the energy stored in transformer 260 to be discharged towards control terminal $100_C$, causing energy to be stored in first buffer capacitor 254. The energy stored in first buffer capacitor 254 may in turn charge control terminal $100_C$, causing power switch 100 to be in a conductive state. In addition, second buffer capacitor 256 may be discharged during the discharging of the energy stored in transformer 260, causing the control terminal of turn-off switch 253 to likewise be discharged and thereby causing turn-off switch 253 to be non-conductive. Accordingly, turn-off switch 253 may no longer couple control terminal $100_C$ to second load terminal $100_{L2}$, thereby enabling charging control terminal $100_C$.

FIG. 3 provides a flowchart of a method 300 for controlling power switch 100 using gate driver 200. For example, method 300 may be performed by control signal generation circuit 220 discussed above. Method 300 may start at a step 301, at which power switch 100 may be in a turned-off state.

At step 301, method 300 may monitor whether input control signal $S_{IN}$ indicates if power switch 100 is to be turned on. If input control signal $S_{IN}$ indicates that power switch 100 is to be turned on, method 300 continues to a step 302. Otherwise, power switch 100 remains in the turned-off state, as indicated by the arrow pointing to a step 308, which corresponds to the turned-off state of power switch 100.

At step 302, method 300 may turn on power switch 100 by providing output control signal $S_{CTRL}$ to control terminal 100C with a exceeding the threshold value of power switch 100, e.g., based on output stage 100 or by providing the turn-on energy based on first buffer capacitor 254.

At step 303, method 300 may monitor whether input control signal $S_{IN}$ indicates if power switch 100 is to be turned off. If input control signal Sm indicates that power switch 100 is to be turned off, method 300 may proceed to a step 304. Otherwise, the method remains at step 303 and continues to keep power switch 100 turned on, as indicated by the arrow pointing to step 302.

At step 304, method 300 may check whether zero-crossing control activation signal $S_{ZCTRL}$ has the zero-crossing control inactive value. If zero-crossing control activation signal $S_{ZCTRL}$ has the zero-crossing control inactive value, method 300 may proceed to step 308 and may thus turn off power switch 100. If instead zero-crossing control activation signal $S_{ZCTRL}$ has the zero-crossing control active value, method 300 may proceed to a step 305.

At step 305, method 300 may start turn-off counter 221 to count the time elapsed since the indication by input control signal to turn off power switch 100. Method 300 may then proceed to steps 306 and 307.

At step 306, method 300 may monitor whether zero-crossing detection signal $S_{ZCD}$ indicates a zero-crossing of the load current of power switch 100. At step 307, method 300 may monitor whether turn-off counter 221 indicates that the time-out interval has elapsed by monitoring time-out signal $S_{TO}$. As will be understood by the above discussion of the safe soft-switching functionality, steps 306 and 307 may be performed substantially simultaneously, as indicated by the arrows pointing from step 306 to step 307 and vice-versa. If either step 306 determines that zero-crossing detection signal $S_{ZCD}$ indicates a zero-crossing of the load current or step 307 determines that time-out signal $S_{TO}$ indicates that the time-out interval has elapsed, method 300 may proceed to step 308 to turn off power switch 100.

Aspects

The implementation may further be illustrated by the following aspects.

In an aspect, a gate driver is configured to control a power switch, comprising a zero-crossing detection circuit configured to receive a load current signal indicative of a load current of the power switch, detect a zero crossing of the load current based on the received load current signal and generate a zero-crossing detection signal based on the detected zero-crossing of the load current signal, and a control signal generation circuit coupled to the zero-crossing detection circuit and configured to receive an input control signal indicative of one of a turn-on and a turn-off of the power switch, if the input control signal is indicative of the turn-off of the power switch (e.g., based on the input control signal indicating the turn-off of the power switch): generate a turn-off signal based on the zero-crossing detection signal, determine if a time-out interval subsequent to the indication of the turn-off has expired, generate the turn-off signal regardless of the zero-crossing detection signal if the time-out interval has expired (e.g., based on the turn-off time expiring), and provide the turn-off signal to a control terminal of the power switch.

In the aspect gate driver, to determine if the time-out interval subsequent to the indication of the turn-off has expired, the control signal generation circuit may be further configured to count a time starting at the indication of the turn-off, and compare the counted time to a time threshold, the time threshold defining the time-out interval.

In the aspect gate driver, the control signal generation circuit may further be configured to receive a zero-crossing control activation signal having a zero-crossing control active value and a zero-crossing control inactive value, and if the input control signal is indicative of the turn-off of the power switch and if the zero-crossing control activation signal has the zero-crossing control inactive value (e.g., based on the input control signal indicating the turn-off of the power switch and based on the zero-crossing control activation signal having the zero-crossing control inactive value), generate the turn-off signal regardless of the zero-crossing detection signal and without determining if the time-out interval has expired.

The aspect gate driver may further include an input side and an output side separated from the input side by a galvanic isolation and a turn-off signal transfer circuit, wherein the control signal generation circuit may be arranged at the input side, and the turn-off signal transfer circuit may be configured to transfer the turn-off signal from the input side to the output side.

In the aspect gate driver, the zero-crossing detection circuit may be arranged at the output side, and the aspect gate driver may further include a zero-crossing transfer circuit configured to transfer the zero-crossing detection signal from the output side to the input side.

In the aspect gate driver, the gate driver may further include an input side and an output side separated from the input side by a galvanic isolation and an input signal transfer circuit, wherein the control signal generation circuit may be arranged at the output side, and the input signal transfer circuit may be configured to transfer at least the input control signal from the input side to the output side.

In the aspect gate driver, the aspect gate driver may further include an input side and an output side separated from the input side by a galvanic isolation and a transformer arranged across the galvanic isolation, the input control signal may be configured to provide power to the gate driver while indicating the turn-on of the power switch, and the control signal generation circuit may be arranged at the input side and may be further configured to, if the input control signal is indicative of the turn-off of the power switch provide power to the gate driver subsequent to the internal control signal indicating the turn-off of the power switch until the generation of the turn-off signal.

In the aspect gate driver, the control signal generation circuit may further be configured to provide the power if the zero-crossing control signal has the zero-crossing control active value.

In the aspect gate driver, the zero-crossing detection circuit may be arranged at the output side, and the aspect gate driver may further include a zero-crossing transfer circuit configured to transfer the zero-crossing detection signal from the output side to the input side.

An aspect method for controlling a power switch using a gate driver may comprise receiving a load current signal indicative of a load current of the power switch, detecting a zero crossing of the load current based on the received load current signal, generating a zero-crossing detection signal based on the detected zero-crossing of the load current signal, receiving an input control signal indicative of one of a turn-on and a turn-off of the power switch and, if the input control signal is indicative of the turn-off of the power switch, generating a turn-off signal based on the zero-crossing detection signal, determining if a time-out interval subsequent to the indication of the turn-off has expired, generating the turn-off signal regardless of the zero-crossing detection signal if the time-out interval has expired, and providing the turn-off signal to a control terminal of the power switch.

In the aspect method, determining if the time-out interval subsequent to the indication of the turn-off has expired may comprise counting a time starting at the indication of the turn-off, and comparing the counted time to a time threshold, the time threshold defining the time-out interval.

The aspect method may further comprise receiving a zero-crossing control activation signal having a zero-crossing control active value and a zero-crossing control inactive value and, if the input control signal is indicative of the turn-off of the power switch and if the zero-crossing control activation signal has the zero-crossing control inactive value, generating the turn-off signal regardless of the zero-crossing detection signal and without determining if the time-out interval has expired.

In the aspect method, the input control signal may be configured to provide power to the gate driver while indicating the turn-on of the power switch, and the method may further comprise providing power to the gate driver subsequent to the input control signal indicating the turn-off of the power switch until the generation of the turn-off signal.

The preceding description has been provided to illustrate a zero-current turn-off driver with safety turn-off functionality. It should be understood that the description is in no way meant to limit the scope of the present disclosure to the precise implementations discussed throughout the description. Rather, the person skilled in the art will be aware that the aspects of the present disclosure may be combined, modified or condensed without departing from the scope of the present disclosure as defined by the following claims.

The invention claimed is:

1. A gate driver configured to control a power switch, comprising:
a zero-crossing detection circuit configured to:
receive a load current signal indicative of a load current of the power switch,
detect a zero-crossing of the load current based on the received load current signal, and
generate a zero-crossing detection signal based on the detected zero-crossing of the load current signal; and
a control signal generation circuit coupled to the zero-crossing detection circuit and configured to:
receive an input control signal indicative of one of a turn-on and a turn-off of the power switch, and
based on the input control signal indicating, with an indication of the turn-off, the turn-off of the power switch:
generate a turn-off signal based on the zero-crossing detection signal,
determine whether a time-out interval subsequent to the indication of the turn-off has expired,
generate the turn-off signal regardless of the zero-crossing detection signal based on the time-out interval expiring, and
provide the turn-off signal to a control terminal of the power switch.

2. The gate driver of claim 1, wherein, to determine if whether the time-out interval subsequent to the indication of the turn-off has expired, the control signal generation circuit is further configured to:
count a time starting at the indication of the turn-off, and compare the counted time to a time threshold, the time threshold defining the time-out interval.

3. The gate driver of claim 1, wherein the control signal generation circuit is further configured to:
receive a zero-crossing control activation signal having a zero-crossing control active value and a zero-crossing control inactive value; and
based on the input control signal indicating the turn-off of the power switch and based on the zero-crossing control activation signal having the zero-crossing control inactive value, generate the turn-off signal regardless of the zero-crossing detection signal and without determining whether the time-out interval has expired.

4. The gate driver of claim 1, wherein the gate driver further includes an input side and an output side separated from the input side by a galvanic isolation and a turn-off signal transfer circuit, wherein:
the control signal generation circuit is arranged at the input side, and
the turn-off signal transfer circuit is configured to transfer the turn-off signal from the input side to the output side.

5. The gate driver of claim 4, wherein:
the zero-crossing detection circuit is arranged at the output side, and
the gate driver further includes a zero-crossing transfer circuit configured to transfer the zero-crossing detection signal from the output side to the input side.

6. The gate driver of claim 1, wherein the gate driver further includes an input side and an output side separated from the input side by a galvanic isolation and an input signal transfer circuit, wherein:
the control signal generation circuit is arranged at the output side, and
the input signal transfer circuit is configured to transfer at least the input control signal from the input side to the output side.

7. The gate driver of claim 1, wherein:
the gate driver further includes an input side and an output side separated from the input side by a galvanic isolation and a transformer arranged across the galvanic isolation,
the input control signal is configured to provide power to the gate driver while indicating the turn-on of the power switch, and
the control signal generation circuit is arranged at the input side and further configured to, based on the input control signal indicating the turn-off of the power switch, provide power to the gate driver subsequent to the input control signal indicating the turn-off of the power switch until the generation of the turn-off signal.

8. The gate driver of claim 3, wherein the control signal generation circuit is further configured to provide power if based on the zero-crossing control activation signal having the zero-crossing control active value.

9. The gate driver of claim 7, wherein:
the zero-crossing detection circuit is arranged at the output side, and
the gate driver further includes a zero-crossing transfer circuit configured to transfer the zero-crossing detection signal from the output side to the input side.

10. A method for controlling a power switch using a gate driver, comprising:
receiving a load current signal indicative of a load current of the power switch;
detecting a zero-crossing of the load current based on the received load current signal;

generating a zero-crossing detection signal based on the detected zero-crossing of the load current signal;

receiving an input control signal indicative of one of a turn-on and a turn-off of the power switch; and based on the input control signal indicating, with an indication of the turn-off, the turn-off of the power switch:

generating a turn-off signal based on the zero-crossing detection signal;

determining whether a time-out interval subsequent to the indication of the turn-off has expired;

generating the turn-off signal regardless of the zero-crossing detection signal based on the time-out interval expiring; and providing the turn-off signal to a control terminal of the power switch.

11. The method of claim 10, wherein determining whether the time-out interval subsequent to the indication of the turn-off has expired comprises:

counting a time starting at the indication of the turn-off, and comparing the counted time to a time threshold, the time threshold defining the time-out interval.

12. The method of claim 10, further comprising:

receiving a zero-crossing control activation signal having a zero-crossing control active value and a zero-crossing control inactive value; and based on the input control signal indicating the turn-off of the power switch and based on the zero-crossing control activation signal having the zero-crossing control inactive value, generating the turn-off signal regardless of the zero-crossing detection signal and without determining if the time-out interval has expired.

13. The method of claim 10, wherein:

the input control signal is configured to provide power to the gate driver while indicating the turn-on of the power switch, and the method further comprises providing power to the gate driver subsequent to the input control signal indicating the turn-off of the power switch until the turn-off signal is generated.

\* \* \* \* \*